(12) United States Patent
Masuyama et al.

(10) Patent No.: US 6,981,239 B2
(45) Date of Patent: Dec. 27, 2005

(54) METHOD, SYSTEM AND APPARATUS FOR CONSTRUCTING RESISTIVE VIAS

(75) Inventors: Jinsaku Masuyama, Round Rock, TX (US); Thad McMillan, Austin, TX (US)

(73) Assignee: Dell Products L.P., Round Rock, TX (US)

(*) Notice: Subject to any disclaimer, the term of this patent is extended or adjusted under 35 U.S.C. 154(b) by 18 days.

(21) Appl. No.: 10/835,157

(22) Filed: Apr. 29, 2004

(65) Prior Publication Data

US 2005/0244999 A1 Nov. 3, 2005

(51) Int. Cl.[7] .............................................. G06F 17/50
(52) U.S. Cl. .......................................... 716/15; 716/5
(58) Field of Search ................................. 716/1, 5, 15

(56) References Cited

U.S. PATENT DOCUMENTS

| | | | |
|---|---|---|---|
| 5,164,699 A | 11/1992 | Smith et al. | 338/310 |
| 5,247,455 A * | 9/1993 | Yoshikawa | 716/15 |
| 5,906,042 A | 5/1999 | Lan et al. | 29/852 |
| 5,990,421 A | 11/1999 | Yee | 174/260 |
| 6,096,411 A | 8/2000 | Nakatani et al. | 428/209 |
| 6,493,861 B1 * | 12/2002 | Li et al. | 716/15 |
| 6,662,429 B1 * | 12/2003 | Domorazek | 29/593 |
| 6,859,915 B1 * | 2/2005 | Frank et al. | 716/5 |
| 2003/0081719 A1 | 5/2003 | Ida et al. | 378/34 |
| 2003/0116856 A1 | 6/2003 | Tomsio et al. | 257/774 |

* cited by examiner

Primary Examiner—Matthew Smith
Assistant Examiner—Binh Tat
(74) Attorney, Agent, or Firm—Baker Botts L.L.P.

(57) ABSTRACT

A system, method and apparatus for constructing capped resistive vias are disclosed. In a preferred embodiment, a bare, electronic component substrate or printed circuit board via is preferably surrounded at each opening by a conductive pad. Defined by openings at a first and second surface of the substrate and a conductive material free wall defining the via is a void filled with one or more resistive inks and/or fills. A conductive cap is preferably coupled to the conductive pads such that an opening therein and the resistive fill exposed at the surface of the substrate is substantially covered. The presence of the conductive cap enables one or more electronic component conductors to be coupled directly to the capped resistive via.

14 Claims, 4 Drawing Sheets

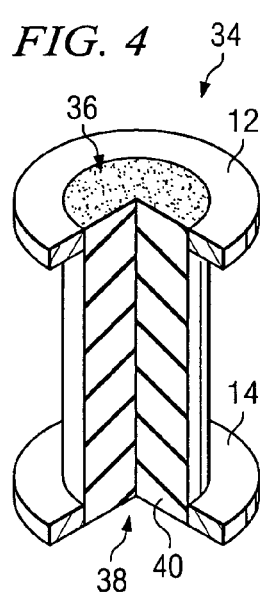
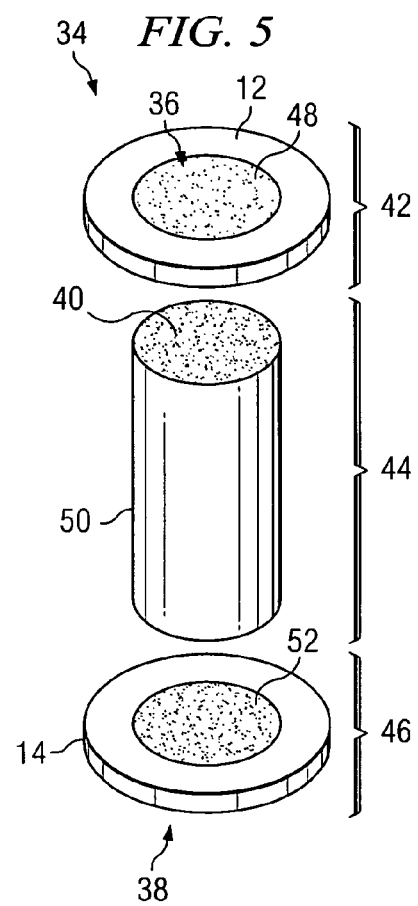
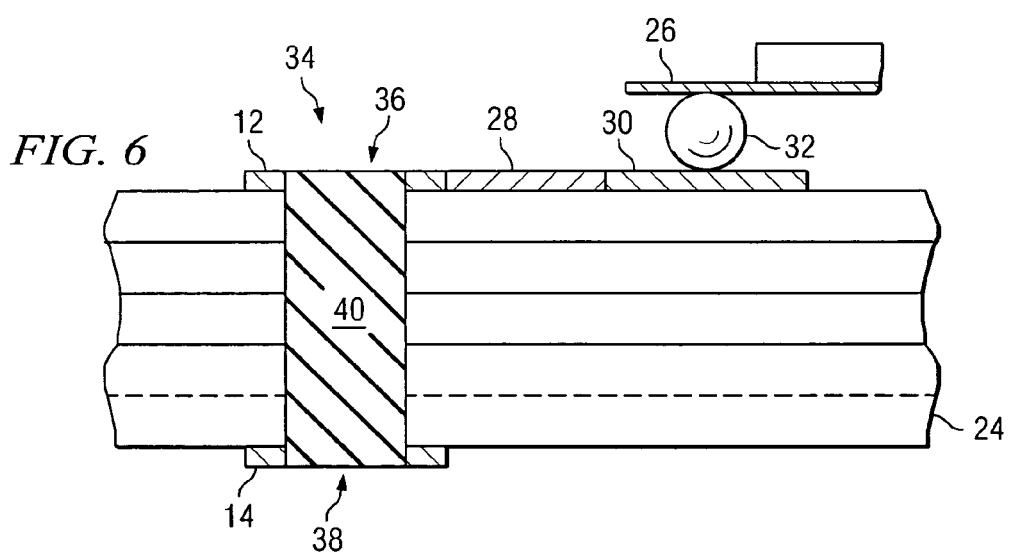

METHOD, SYSTEM AND APPARATUS FOR CONSTRUCTING RESISTIVE VIAS

TECHNICAL FIELD

The present invention relates generally to information handling systems and, more particularly, to information handling system printed circuit boards.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

With the growing complexity of information handling systems has come corresponding increase in component density on the system boards of such devices. However, along with the calls for increased functionality, capability, performance, etc., have come calls for reducing the footprint of such enhanced information handling systems. As a result, the problem of placing more functionality into a smaller footprint has made information handling system design as much of a puzzle solution routine as it is an engineering effort.

SUMMARY

In accordance with teachings of the present disclosure, a system including memory, a processor and at least one printed circuit board operable to maintain the memory and the processor is disclosed. In a preferred embodiment, the printed circuit board preferably includes a plurality of through-hole vias disposed therein with a selected subset of the through-hole vias configured as resistive vias having at least one type of resistive fill disposed therein. Preferably, the resistive fill disposed in the selected subset of resistive vias is such that an impedance measure, $Z_{VIA}$, for the resistive vias substantially approximates $$Z_{VIA} = \frac{Z_{FILL} \times L_{VIA}}{\pi r_{VIA}^2}$$

where $Z_{FILL}$ is an impedance measure for the resistive fill disposed in the via, $L_{VIA}$ is a via length measure and $r_{VIA}$ is a via inner radius measure.

Also in accordance with teachings of the present disclosure, an apparatus for maintaining one or more electronic components is disclosed. In a preferred embodiment, the apparatus preferably includes a multi-layered substrate having opposing first and second surfaces spaced apart by a separation length. In addition, the apparatus preferably includes a plurality of vias disposed in the substrate and having at least one opening and at least one side wall defining a void. Further, at least a portion of the plurality of vias defining through-hole vias travel substantially approximately the separation length of the substrate and have an opening at the first and second surfaces of the substrate and at least one side wall defining a void. In addition, a selected subset of the through-hole vias preferably include a resistive fill disposed therein and a copper pad disposed on the first and second surfaces of the substrate, proximate an edge of the resistive filled vias.

Further in accordance with teachings of the present disclosure, a method for creating a component substrate is disclosed. In a preferred embodiment, the method preferably includes identifying desired placement and connectivity of one or more electronic components on a multi-layered substrate. The preferred embodiment preferably also includes identifying a placement location for one or more resistive vias to be associated with the one or more electronic components. In addition, the method preferably includes identifying a desired impedance value for one or more resistive vias and determining a length distance between a first surface and second surface of the multi-layered substrate at each resistive via placement location. Still further, the method preferably includes determining an available spacing between one or more structures included on the multi-layer substrate and each resistive via location for each resistive via placement location. Continuing, the method preferably also includes balancing an impedance value associated with one or more available resistive fills with the available spacing between one or more structures and a selected resistive via placement location to achieve the desired impedance value, $Z_{VIA}$, for each resistive via in accordance with $$Z_{VIA} = \frac{Z_{FILL} \times L_{VIA}}{\pi r_{VIA}^2}$$

where $Z_{FILL}$ is an impedance value associated with an available resistive fill, $L_{VIA}$ is a length distance between the first and second surfaces of the substrate and $r_{VIA}$ is a measure of through-hole via radius. Preferably, the balancing operation is performed such that each through-hole via does not interfere with one or more structures included on the substrate and such that a resistive fill selection and $r_{VIA}$ measure are obtained. The method according to the present disclosure preferably also provides for drilling a plurality of through-hole vias in the multilayer substrate in accordance with the desired placement and connectivity of the one or more electronic components and the obtained $r_{VIA}$ measure as well as the screening of the selected resistive fill into the one or more through-hole vias at the identified resistive fill placement locations.

In one aspect, teachings of the present disclosure provide the technical advantage of enabling a plurality of different resistive fills or inks to be utilized in the creation of resistive vias such that the resistance values that may be achieved in a resistive via are substantially unlimited.

In another aspect, teachings of the present disclosure provide the technical advantage of providing a metal cap to seal a resistive via such that direct soldering of an electronic component onto a resistive via may be accomplished.

In yet another aspect, teachings of the present disclosure provide the technical advantage of improving component substrate real estate usage by facilitating the placement of resistive components associated with electronic devices at the edge of a substrate as well as the ability to dispose the resistive components substantially in the "Z" plane at any position on the substrate.

In a further aspect, teachings of the present disclosure provide the technical advantage of simplifying design calculations by creating a resistive via that can be modeled as a single component.

In another aspect, teachings of the present disclosure provide the technical advantage of increasing the area of contact between a conductive cap and a resistive via such that the resistance introduced from contact between a resistive via with a small conductive pad is substantially eliminated.

In still another aspect, teachings of the present disclosure provide the technical advantage of minimizing the need to use multiple resistive vias to achieve varying ranges of resistance at a designated resistive via placement location.

In yet another aspect, teachings of the present disclosure provide the technical advantage of permitting the use of fewer resistive vias and/or other vias in a substrate such that surface real estate is preserved for components and traces which, simultaneously, reduces or eliminates the need for the addition of layers to existing system board deployments and integrated circuit packaging.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 4 is a perspective view with portions cut away, showing a through-hole via having conductive pads and configured to operate as a resistive via according to teachings of the present disclosure;

FIG. 5 is an exploded view, illustrating the resistive via of FIG. 4 according to teachings of the present disclosure;

FIG. 6 is a cross-sectional view of the coupling between an electronic component and a resistive via according to teachings of the present disclosure;

DETAILED DESCRIPTION

Preferred embodiments and their advantages are best understood by reference to FIGS. 1 through 11, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
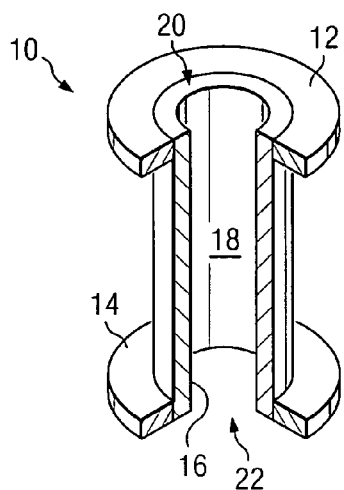
FIG. 1 is a perspective, with portions cut away, showing a plated through-hole via according to teachings of the present disclosure.

Referring first to FIG. 1, a perspective view, of a plated through-hole via 10, with portions cut away, is shown according to teachings of the present disclosure. In use on an electronic component substrate, such as a printed circuit board (not expressly shown), plated through-hole via 10 preferably enables one or more electronic components to be coupled to one or more layers of the associated substrate as well as one or more components on opposing surfaces of the substrate.

As illustrated in FIG. 1, plated through-hole via 10 preferably includes conductive pad 12 and 14. In one embodiment, conductive pad 12 may be formed from copper and disposed on a first surface of an associated printed circuit board or substrate. Likewise, conductive pad 14 may be formed from copper and disposed on an opposing, second surface of the associated printed circuit board. Plated through-hole via 10 preferably also includes side wall 16.

As illustrated in FIG. 1, sidewall 16 of through-hole via 10 may be formed from a layer of copper disposed on an internal wall of a through-hole via disposed in the associated printed circuit board or substrate. Accordingly, plated through-hole via 10 may be described as an aperture drilled through the first and second surfaces of a substrate or printed circuit board, having screened or otherwise applied thereon one or more conductive materials, such as copper, thereby defining sidewall 16 and, simultaneously, void 18. As discussed in greater detail below, conductive pad 12 and/or 14 may be connected to one or more connecting traces or other structures included on a first and second surface, respectively, of an associated substrate, such as a printed circuit board.

Opening 20 and/or 22 on first and second surfaces of an associated substrate or printed circuit board, respectively, may be configured to receive one or more electrical or communicative leads or contacts from one or more electronic components to be maintained by an associated substrate or printed circuit board. Opening 20 and/or opening 22 may also be configured to perform other operations in accordance with teachings of the present disclosure.

Figure 2:
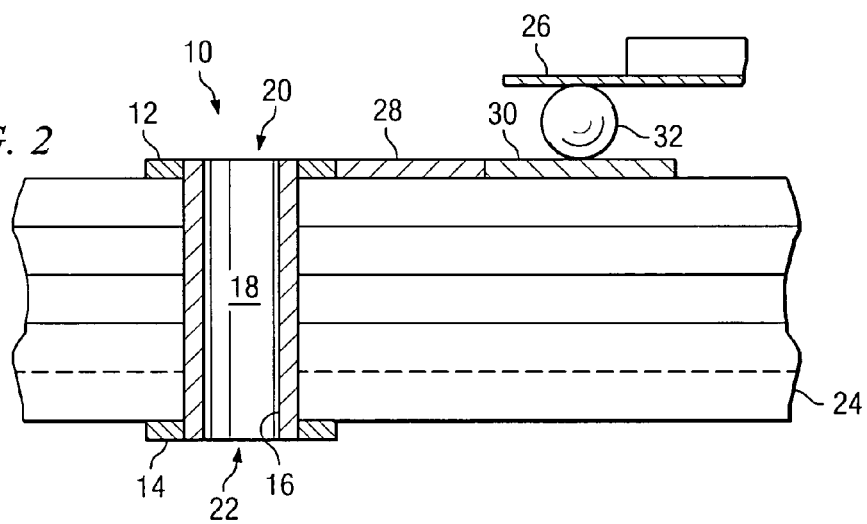
FIG. 2 is a cross-sectional view of the coupling between an electronic component and a plated through-hole via according to teachings of the present disclosure.

Referring now to FIG. 2, one embodiment of a coupling between an electronic component and a conductive through-hole via 10 is shown according to teachings of the present disclosure. As illustrated in FIG. 2, plated through-hole via 10 is shown disposed in a multi-layered substrate, printed circuit board 24. Depending on a particular implementation, one or more layers of multi-layered printed circuit board 24 may include one or more communicative traces, one or more power planes, power planes and communicative traces, as well as other structures or components used in implementing information handling system boards, integrated circuit packaging, chip carriers or other electronic component substrates.

In the embodiment of the coupling between printed circuit board 24 and electronic component 26 illustrated in FIG. 2, connecting trace 28 and conductive land 30 are employed. Preferably using surface mount technology, electronic component 26 may be coupled to conductive or copper land 30 using solder ball 32 and appropriate soldering operations performed thereon.

Figure 3:
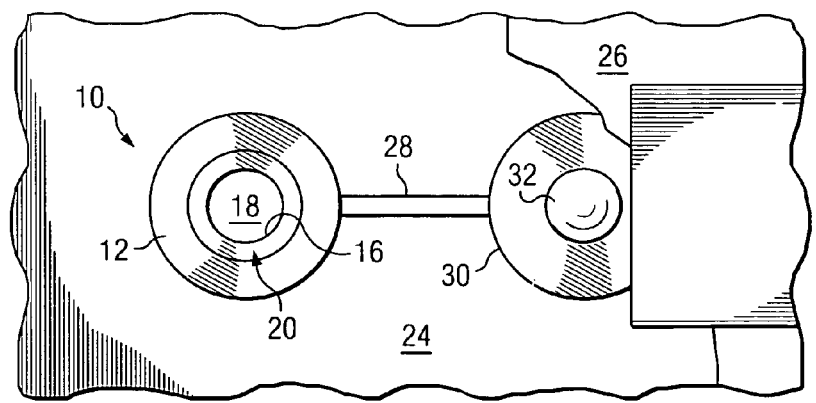
FIG. 3 is a schematic drawing, with portions cut away, showing an alternative view of the electronic component coupling to a plated through-hole via illustrated in FIG. 2 according to teachings of the present disclosure.

Referring now to FIG. 3, a schematic drawing, with portions cut away, depicting the coupling between electronic component 26 and multi-layer printed circuit board 24 of FIG. 2 is shown according to teachings of the present disclosure. As illustrated in FIG. 3, plated through-hole via 10 preferably includes copper pad 12 disposed on a first surface of multi-layer printed circuit board 24. Copper pad 12, along with side wall 16 preferably cooperate to form void 18 travelling through multi-layer printed circuit board 24 as well as opening 20 on the first surface of multi-layer printed circuit board 24.

In some implementations, it may not be convenient or physically possible to couple one or more electronic components directly to plated through-hole via 10. In such embodiments, one method that may be employed to connect the electronic component to plated though-hole via 10 involves the use of one or more connecting traces to a fan-out conductive land 30. Generally, connecting trace 28 and conductive land 30 preferably cooperate to connect a contact or lead of an electronic component to plated through-hole via 10 for purposes including, but not limited to, signal transfer, power transfer, as well as other operations.

As illustrated in FIGS. 2 and 3, solder ball 32 is preferably positioned in contact with conductive land 30 as well as with one or more signal or power leads or contacts of electronic component 26. Upon the application of appropriate heat or other soldering influence, solder ball 32 preferably fixedly engages electronic component 26 to conductive land 30 such that power and/or signals as well as other performance characteristics may be enabled therethrough.

Referring now to FIG. 4, an embodiment of a resistive via is shown according to teachings of the present disclosure. As shown in FIG. 4, resistive via 34 preferably includes conductive pad 12 on a first surface of an associated substrate or printed circuit board. In addition, resistive via 34 preferably also includes conductive pad 14 disposed on a second surface of an associated substrate or printed circuit board. In such an embodiment, resistive via 34 has a length substantially defined by the separation distance between the first and second surfaces of the associated printed circuit board or electronic component substrate.

Resistive via 34, generally defined at each end by conductive pads 12 and 14 may be further defined by openings 36 on a first surface opening 38 on a second surface of an associated substrate such as multilayer printed circuit board 24. Disposed in the void defined by opening 36, opening 38 and a drilled hole travelling from the first surface to second surface of an associated substrate or printed circuit board is one or more resistive inks, fills or pastes. As shown in FIG. 4, the combination of one or more resistive fills, inks or pastes disposed in a via generally create resistive material column 40.

Referring now to FIG. 5, an alternate view of resistive via 34 of FIG. 4 is shown according to teachings of the present disclosure. As shown in FIG. 5, resistive via 34 may be conceptually divided into first, second and third resistive elements 42, 44 and 46, respectively.

First resistive element 42 generally includes conductive or copper pad 12 and portion 48 of resistive fill, ink or paste column 40 disposed in opening 36. Second resistive element 44 includes column portion 50 of resistive paste, ink and/or fill column 40, wherein the bounds of resistive paste, ink and/or fill column 50 are generally dictated by the dimensions of an associated through-hole disposed in an associated printed circuit board. Third resistive element 46 of resistive through-hole via 34 generally includes conductive or copper pad 14 as well as resistive paste, ink and/or fill portion 52 of column 40 disposed in opening 38.

In order to properly calculate the total resistance or impedance provided by a resistive through-hole via such as resistive via 34, account must be made for the impedance provided in first resistive element 42, second resistive element 44 and third resistive element 46. In particular, based on the arrangement of first and third resistive elements 42 and 44, respectively, account must be made for the region of contact between conductive or copper pad 12 and resistive fill, ink and/or paste portion 48 of first resistive element 42 and the contact between conductive or copper pad 14 and resistive fill portion 52 of third element 46. As such, resistive via 34 creates more complex calculations when attempting to determine a total impedance or resistive value therefor.

Figure 7:
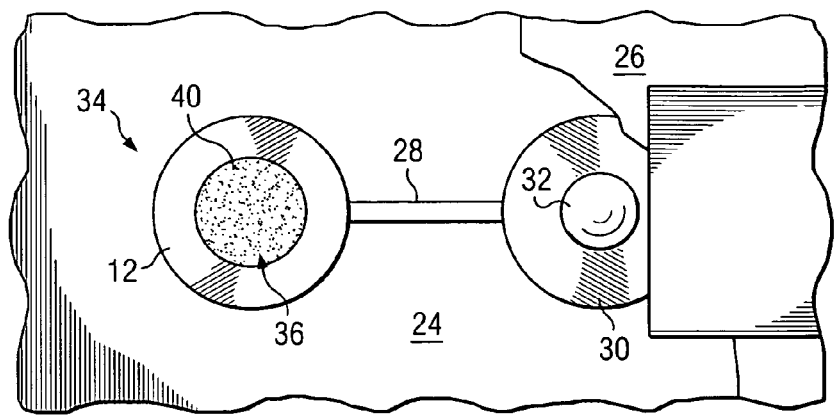
FIG. 7 is a schematic drawing, with portions cut away, showing an alternative view of the electronic component and resistive via coupling illustrated in FIG. 6 according to teachings of the present disclosure.

Referring now to FIGS. 6 and 7, an embodiment of a coupling between an electronic component and through-hole resistive via 34 using fan-out, surface mount technology is shown according to teachings of the present disclosure. Similar to the configuration discussed above with respect to FIG. 2, electronic component 26 may be coupled to conductive or copper land 30 using one or more solder balls 32. Conductive or copper land 30 may then be coupled to conductive or copper pad 12 using one or more conductive traces 28. In circumstances where the real estate available substrate or on printed circuit board 24 is limited, a resistive via such as resistive through-hole via 34 may be employed as generally depicted in FIGS. 6 and 7 as a termination point for one or more contacts or conductors on electronic component 26 as well as for myriad other purposes.

Figure 8:
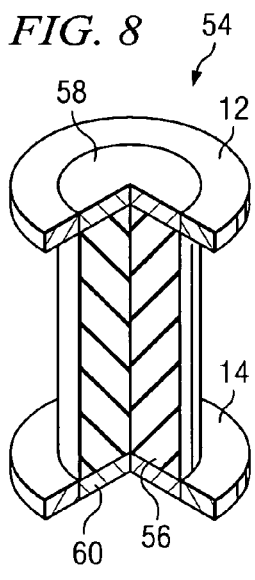
FIG. 8 is a perspective view, with portions cut away, illustrating a capped resistive via according to teachings of the present disclosure.

Referring now to FIG. 8, a preferred embodiment of a capped, resistive via is shown according to teachings of the present disclosure. As illustrated in FIG. 8, capped resistive via 54 preferably includes conductive or copper pads 12 and 14 at respective ends thereof. Disposed in an opening of an associated substrate or printed circuit board generally defined by an opening at conductive or copper pad 12 and in an opening at conductive or copper pad 14, is one or more resistive pastes, fills and/or inks forming resistive column 56. In a preferred embodiment, the aperture drilled in an associated substrate or printed circuit board designated to house capped, resistive via 54 is preferably a bare through-hole, i.e., having little or no conductive materials disposed on the sidewalls thereof.

To be most effective, the inner walls of a capped resistive via formed in accordance with teachings of the present disclosure preferably do not include any conductive materials thereon. At a minimum, the inner walls of a capped resistive via formed in accordance with teachings of the present disclosure preferably do not include conductive materials disposed thereon and electrically connecting first and second conductors of an associated substrate layer or layers.

To create one embodiment of a capped, resistive via in accordance with teachings of the present disclosure, a conductive cap is preferably placed substantially over one or more exposed ends of a resistive via such that the conductive cap substantially covers the exposed resistive fill and/or ink and contacts conductive or copper pads 12 or 14. As shown in FIG. 8, conductive cap 58 is disposed proximate conductive or copper pad 12 such that the resistive fill forming resistive column 56 is covered. In a further embodiment, as illustrated in FIG. 8, conductive cap 60 may be disposed proximate conductive or copper pad 14 such that conductive cap 60 substantially covers exposed resistive paste, fill and/or ink at a second surface of an associated printed circuit board or substrate.

In one embodiment, conductive cap 58 may be disposed within an opening at one or more ends of via 54 or covering a portion to all of one or more of conductive pads 12 and/or 14. Alternate placement of conductive cap 58 may be implemented in accordance with teachings of the present disclosure.

Figure 9:
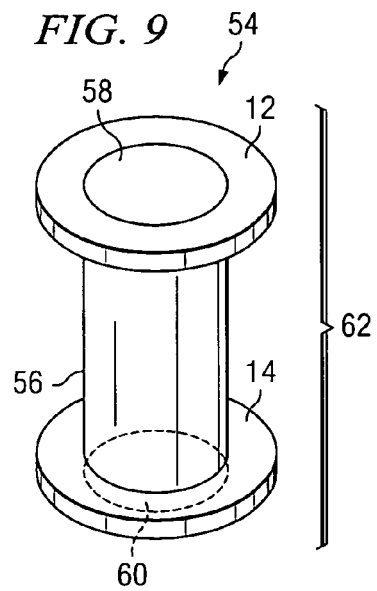
FIG. 9 is an alternate view of the capped resistive via illustrated in FIG. 8 according to teachings of the present disclosure.

Referring now to FIG. 9, a representative embodiment of capped resistive via 54 is shown according to teachings of the present disclosure. In comparison to the configuration discussed above with respective to FIGS. 4 and 5, capped resistive via 54 may be conceptualized as single resistive element 62. As a single resistive element 62, the overall impedance or resistance of capped resistive through-hole via 54 may be represented by the formula $$Z_{VIA} = \frac{Z_{FILL} \times L_{VIA}}{\pi r_{VIA}^2}$$

where $Z_{FILL}$ is an impedance measure for the resistive inks and/or fills forming column 56, $L_{VIA}$ is a measure of via length measure and $r_{VIA}$ is a via radius measure, preferably an inner via radius measure. In accordance with teachings of the present disclosure, at least a via inner radius and the impedance available from one or more resistive pastes, fills, inks or combinations thereof may be manipulated in order to achieve a capped, resistive through-hole or other via form having a desired impedance or resistive value at substantially any location of an electronic component substrate or printed circuit board.

For example, where available substrate or printed circuit board real estate is limited, higher resistivity pastes, fills and/or inks may be selected in order to achieve a selected via resistance value. In an alternate example, where substrate or printed circuit board real estate is substantially readily available, via diameter, and associated radius, may be larger such that overall via resistance may be increased.

In one aspect, the use of capped, resistive vias may reduce or eliminate the need for positioning multiple resistive vias in connection to achieve higher resistivity values. Further, by enabling a wide variety of resistance values to be achieved via the use of a capped resistive vias, the placement of capped resistive vias in the "Z" axis of a substrate or printed circuit board frees additional substrate or printed circuit board real estate for use as power transmission planes, communication signal traces, as well as for other purposes.

Figure 10:
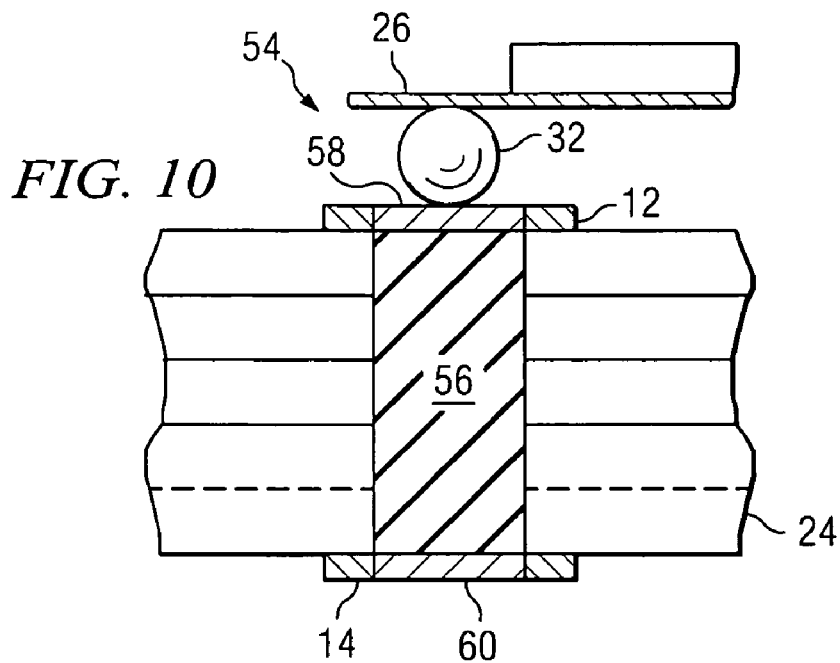
FIG. 10 is a cross-sectional view of the coupling between an electronic component and a capped resistive via according to teachings of the present disclosure.
Figure 11:
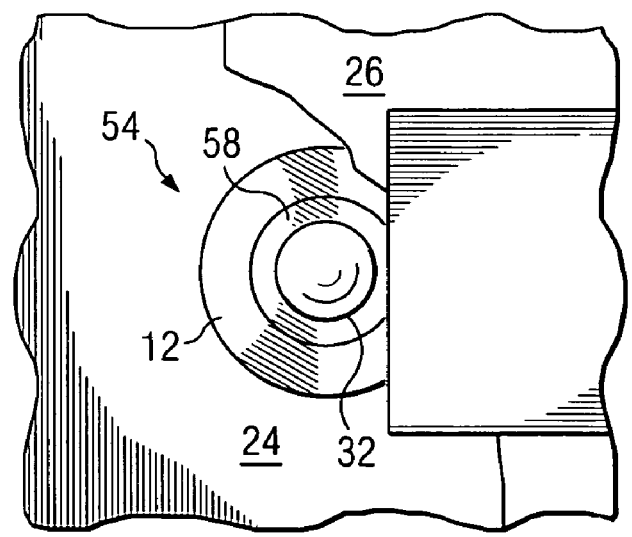
FIG. 11 is a schematic drawing, with portions cut away, illustrating the connection between an electronic component and capped resistive via of FIG. 10 according to teachings of the present disclosure.

Referring now to FIGS. 10 and 11, one embodiment of a method for coupling an electronic component to a capped resistive through-hole via is shown according to teachings of the present disclosure. In contrast to the coupling described above with respect to FIGS. 2 and 3 and with respect to FIGS. 6 and 7, teachings of the present disclosure enable an electronic component to be coupled, such as by using one or more soldering, surface mount technology or other techniques, directly to capped resistive via 54. By including conductive caps 58 and/or 60 on capped resistive via 54, electronic component 26 may be communicatively or electrically coupled to conductive cap 58 and/or conductive cap 60 using one or more solder balls 32 or an alternate coupling technology. In this manner, capped, resistive via 54 may be used in place of one or more fan-out components such that additional substrate or printed circuit board surface real estate is available for signal traces, power transmission planes or other structures or purposes.

Although the disclosed embodiments have been described in detail, it should be understood that various changes, substitutions and alterations can be made to the embodiments without departing from their spirit and scope.

What is claimed is:

1. An information handling system, comprising:
   memory;
   a processor operably associated with the memory;
   at least one printed circuit board operable to maintain the memory and the processor; and
   a plurality of through-hole vias disposed in the printed circuit board, a selected subset of the plurality of through-hole vias configured as resistive vias having at least one type of resistive fill disposed therein such that an impedance measure, $Z_{VIA}$, for the resistive vias substantially approximates $$Z_{VIA} = \frac{Z_{FILL} \times L_{VIA}}{\pi r_{VIA}^2}$$

where $Z_{FILL}$ is an impedance measure for the resistive fill disposed in the via, $L_{VIA}$ is a measure of via length and $r_{VIA}$ is a measure of via radius.

2. The information handling system of claim 1, further comprising the selected subset of resistive vias including bare plated through-hole vias.

3. The information handling system of claim 1, further comprising a conductive cap disposed over resistive fill exposed proximate at least one open end of a resistive via.

4. The information handling system of claim 3, further comprising a conductive pad disposed about the open end of the resistive via and wherein the conductive cap is operably coupled to the conductive pad.

5. The information handling system of claim 3, further comprising one or more electronic components operably coupled to the printed circuit board using surface mount technology at the conductive cap of a resistive via.

6. The information handling system of claim 1, further comprising a connecting trace operably coupled to a resistive via.

7. The information handling system of claim 6, further comprising a copper land operably coupled to a resistive via using the connecting trace.

8. The information handling system of claim 7, further comprising one or more electronic components operably coupled to the printed circuit board using surface mount technology at the copper land associated with a resistive via.

9. A method for creating a component substrate, comprising:
 identifying desired placement and connectivity of one or more electronic components on a multi-layered substrate;
 identifying a placement location for one or more resistive vias to be associated with the one or more electronic components;
 identifying a desired impedance value for one or more resistive vias;
 determining a length distance between a first surface and a second surface of the multi-layered substrate at each resistive via placement location;
 determining an available spacing between one or more structures included on the multi-layer substrate and each resistive via location for each resistive via placement location;
 balancing an impedance value associated with one or more available resistive fills with the available spacing between one or more structures and a selected resistive via placement location to achieve the desired impedance value, $Z_{VIA}$, for each resistive via in accordance with $$Z_{VIA} = \frac{Z_{FILL} \times L_{VIA}}{\pi r_{VIA}^2}$$

where $Z_{FILL}$ is the impedance value associated with an available resistive fill, $L_{VIA}$ is the length distance between the first and second surfaces of the substrate and $r_{VIA}$ is a measure of through-hole via inner radius, such that each through-hole via does not interfere with the one or more structures included on the substrate and such that a resistive fill selection and $r_{VIA}$ measure are obtained;
 drilling a plurality of through-hole vias in the multi-layered substrate in accordance with the desired placement and connectivity of the one or more electronic components and the obtained $r_{VIA}$ measure; and
 screening the selected resistive fill into the one or more through-hole vias at the identified resistive via placement locations.

10. The method of claim 9, further comprising:
 screening the resistive fill into the through-hole vias such that the screened resistive fill is exposed proximate the first and second surfaces of the substrate; and
 covering the exposed resistive fill with a conductive cap such that an electronic component may be communicatively coupled thereto.

11. The method of claim 10, further comprising coupling at least one contact of an electronic component to the conductive cap using surface mount technology.

12. The method of claim 9, further comprising coupling a copper pad proximate one or more through-hole via openings.

13. The method of claim 12, further comprising:
 applying one or more connecting traces to the substrate and coupled to the copper pads; and
 coupling one or more copper lands to the connecting traces.

14. The method of claim 13, further comprising coupling at least one contact of an electronic component to the copper land using surface mount technology.

* * * * *